(12) United States Patent
Gao et al.

(10) Patent No.: US 12,292,632 B2
(45) Date of Patent: *May 6, 2025

(54) DISPLAY PANEL AND MANUFACTURE METHOD THEREOF, AND DISPLAY APPARATUS

(71) Applicant: BOE TECHNOLOGY GROUP CO., LTD., Beijing (CN)

(72) Inventors: Xinwei Gao, Beijing (CN); Kaihong Ma, Beijing (CN); Dacheng Zhang, Beijing (CN); Lang Liu, Beijing (CN); Chen Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/663,458

(22) Filed: May 14, 2024

(65) Prior Publication Data

US 2024/0298461 A1    Sep. 5, 2024

Related U.S. Application Data

(63) Continuation of application No. 18/098,210, filed on Jan. 18, 2023, now Pat. No. 12,016,198, which is a
(Continued)

(51) Int. Cl.
*G02F 1/1333* (2006.01)
*H10K 50/842* (2023.01)
(Continued)

(52) U.S. Cl.
CPC ... *G02F 1/133311* (2021.01); *H10K 50/8426* (2023.02); *H10K 50/844* (2023.02);
(Continued)

(58) Field of Classification Search
CPC . H10K 59/131; H10K 50/844; H10K 50/8426
See application file for complete search history.

(56) References Cited

U.S. PATENT DOCUMENTS 11,380,865 B2    7/2022  Sun et al.
11,937,446 B2 *  3/2024  Gao .................. H10K 59/8722
(Continued)

FOREIGN PATENT DOCUMENTS

CN    106784368 A    5/2017
CN    108279521 A    7/2018
(Continued)

OTHER PUBLICATIONS

Extended European Search Report form European Patent Application No. 19945467.9 dated May 10, 2022.
(Continued)

*Primary Examiner* — Mark W Tornow
(74) *Attorney, Agent, or Firm* — Dilworth & Barrese, LLP.; Michael J. Musella, Esq.

(57) ABSTRACT

A display panel and a manufacture method thereof, and a display apparatus are provided. The display panel has a display region and a border region that surrounds the display region and includes a peripheral circuit region and a peripheral region; the peripheral circuit region is between the display region and the peripheral region. At least a part of a barrier structure of the display panel is in the peripheral circuit region, and the barrier structure includes an organic barrier layer including an opening passing through the organic barrier layer and an inorganic barrier layer covering the organic barrier layer and filling the opening; an extension direction of the opening is same as that of an edge, close to the opening, of the display panel; the peripheral circuit is in the peripheral circuit region.

20 Claims, 5 Drawing Sheets

Related U.S. Application Data continuation of application No. 16/977,285, filed as application No. PCT/CN2019/112245 on Oct. 21, 2019, now Pat. No. 11,937,446.

(51) Int. Cl.
  *H10K 50/844* (2023.01)
  *H10K 59/12* (2023.01)
  *H10K 59/131* (2023.01)
  *H10K 59/80* (2023.01)
  *H10K 71/00* (2023.01)

(52) U.S. Cl.
  CPC ....... *H10K 59/131* (2023.02); *H10K 59/8722* (2023.02); *H10K 59/873* (2023.02); *H10K 71/00* (2023.02); *H10K 59/1201* (2023.02)

(56) References Cited

U.S. PATENT DOCUMENTS

| | | | |
|---|---|---|---|
| 12,016,198 B2* | 6/2024 | Gao | .............. H10K 50/844 |
| 2004/0232459 A1 | 11/2004 | Takayama et al. | |
| 2015/0115230 A1 | 4/2015 | Yoon et al. | |
| 2017/0110477 A1 | 4/2017 | Han et al. | |
| 2018/0342564 A1 | 11/2018 | Hanari et al. | |
| 2019/0058021 A1* | 2/2019 | Kim | .............. H10K 59/8722 |
| 2019/0148469 A1 | 5/2019 | Lhee et al. | |
| 2019/0165312 A1* | 5/2019 | Bae | .............. H10K 59/873 |
| 2020/0295310 A1 | 9/2020 | Moon et al. | |
| 2020/0303485 A1 | 9/2020 | Jin et al. | |
| 2021/0104592 A1* | 4/2021 | Kim | .............. H10K 59/131 |
| 2021/0210719 A1 | 7/2021 | Sun et al. | |

FOREIGN PATENT DOCUMENTS

| | | |
|---|---|---|
| CN | 109001949 A | 12/2018 |
| CN | 109461832 A | 3/2019 |
| CN | 109671870 A | 4/2019 |
| CN | 109920935 A | 6/2019 |
| KR | 20170090382 A | 8/2017 |
| KR | 20190055574 A | 5/2019 |
| KR | 10-2019-0079998 A | 7/2019 |
| WO | 2018205673 A1 | 11/2018 |

OTHER PUBLICATIONS

Chinese International Search Report from International Application No. PCT/CN2019/112245 mailed Jul. 28, 2020.
US Office Action mailed Aug. 17, 2023 in U.S. Appl. No. 18/098,210.
Extended European Search Report from European Patent Application No. 23152180.8 dated Apr. 11, 2023.
US Office Action mailed Aug. 17, 2023 in U.S. Appl. No. 16/977,285.
US Notice of Allowance mailed Dec. 15, 2023 in U.S. Appl. No. 16/977,285.
US Office Action mailed Dec. 6, 2023 in U.S. Appl. No. 18/098,210.
US Notice of Allowance mailed Feb. 22, 2024 in U.S. Appl. No. 18/098,210.
European Office Action mailed Jun. 27, 2024 in Application No. 19945467.9.

* cited by examiner

DISPLAY PANEL AND MANUFACTURE METHOD THEREOF, AND DISPLAY APPARATUS

This patent application is a continuation of U.S. Ser. No. 18/098,210 filed on Jan. 18, 2023 which is a continuation of U.S. Ser. No. 16/977,285 filed on Sep. 1, 2020 which is a national stage application of international application PCT/CN2019/112245 filed on Oct. 21, 2019, the entire contents of all these applications are hereby incorporated by reference herein in its entirety.

TECHNICAL FIELD

At least one embodiment of the present disclosure relates to a display panel and a manufacture method thereof, and a display apparatus.

BACKGROUND

The performance and service life of OLED devices are easily affected by moisture and oxygen, and it is very significant to block the contact between moisture, oxygen and the OLED devices by effective sealing technologies. At the same time, the narrow border is the development trend of OLED display screens. For example, generally, the distance between the encapsulation frame of the display region and the light-emitting region (AA region) can be reduced to meet the requirements of the narrow border.

SUMMARY

At least one embodiment of the present disclosure provides a display panel, the display panel has a display region and a border region surrounding the display region, the border region comprises a peripheral circuit region and a peripheral region, and the peripheral circuit region is between the display region and the peripheral region; the display panel comprises: a base substrate; a barrier structure, a peripheral circuit, a encapsulation substrate, and a encapsulation sealant. At least a part of the barrier structure is in the peripheral circuit region on the base substrate, and the barrier structure comprises: an organic barrier layer, and an inorganic barrier layer. The organic barrier layer comprises an opening passing through the organic barrier layer, an extension direction of the opening is substantially same as an extension direction of an edge, close to the opening, of the display panel, in the display panel; and the inorganic barrier layer covers the organic barrier layer and fills the opening; the peripheral circuit is on the base substrate and in the peripheral circuit region; the encapsulation substrate is on a side of the barrier structure away from the base substrate; and the encapsulation sealant is filled between the base substrate and the encapsulation substrate, and covers the display region and the peripheral circuit region.

For example, the display panel provided by an embodiment of the present disclosure further comprises: a frame sealant, in the peripheral region, and connected to the base substrate and the encapsulation substrate, respectively, and the encapsulation sealant is filled in a region surrounded by the frame sealant, the base substrate, and the encapsulation substrate.

For example, in the display panel provided by an embodiment of the present disclosure, the organic barrier layer is on a side, close to the display region, of the frame sealant, and the inorganic barrier layer comprises a portion between the organic barrier layer and the frame sealant.

For example, in the display panel provided by an embodiment of the present disclosure, a gap is provided between the inorganic barrier layer and the frame sealant.

For example, in the display panel provided by an embodiment of the present disclosure, a direction from the display region to the border region is a first direction, and the peripheral circuit comprises a first signal wire and a function component; the first signal wire extends in a second direction that intersects the first direction; an orthographic projection of the first signal wire on the base substrate is within an orthographic projection of the organic barrier layer on the base substrate, and an orthographic projection of the opening on the base substrate does not overlap with the orthographic projection of the first signal wire on the base substrate.

For example, in the display panel provided by an embodiment of the present disclosure, the peripheral circuit comprises a plurality of the first signal wires, the plurality of the first signal wires are in a same layer and a gap is provided between two adjacent first signal wires of the plurality of the first signal wires, and the orthographic projection of the opening on the base substrate is in an orthographic projection of the gap between two adjacent first signal wires of the plurality of the first signal wires on the base substrate.

For example, the display panel provided by an embodiment of the present disclosure further comprises: a protection layer which covers the first signal wire and is between the first signal wire and the organic barrier layer.

For example, in the display panel provided by an embodiment of the present disclosure, the protection layer is in the border region, a gap is provided between the protection layer and the display region, and the inorganic barrier layer covers the protection layer.

For example, in the display panel provided by an embodiment of the present disclosure, a direction from the display region to the border region is a first direction, and the peripheral circuit comprises a second signal wire extending from the display region to the border region along the first direction; the second signal wire comprises a first portion and a second portion connected in series with each other, the first portion is exposed by the opening, and the second portion is not exposed by the opening; the first portion comprises at least two wires connected in parallel, and the second portion is a single wire.

For example, the display panel provided by an embodiment of the present disclosure further comprises: an encapsulation layer covering the display region and the inorganic barrier layer.

For example, in the display panel provided by an embodiment of the present disclosure, the opening comprises a first opening which is in a closed annular shape, surrounding the display region; and the first opening which is in the closed annular shape divides the organic barrier layer into an inner portion close to the display region and an outer portion away from the display region, the inner portion is in a closed annular shape and surrounds the display region, and the outer portion is in a closed annular shape and surrounds the first opening.

For example, in the display panel provided by an embodiment of the present disclosure, the organic barrier layer comprises a plurality of openings in the border region.

For example, in the display panel provided by an embodiment of the present disclosure, the opening further comprises a non-annular opening spaced apart from the first opening, and the non-annular opening is at least in one of the outer portion or the inner portion.

For example, in the display panel provided by an embodiment of the present disclosure, a width of the opening in a direction from the border region to the display region ranges from 1 μm to 5000 μm.

For example, the display panel provided by an embodiment of the present disclosure further comprises: a planarization layer, comprising a portion in the display region and a portion in the border region; the portion, in the border region, of the planarization layer serves as the organic barrier layer.

For example, the display panel provided by an embodiment of the present disclosure further comprises: a light-emitting device, on the portion of the planarization layer in the display region.

For example, in the display panel provided by an embodiment of the present disclosure, a direction from the display region to the border region is a first direction, and a width of the border region in the first direction is equal to or larger than 5 mm.

At least one embodiment of the present disclosure further provides a display apparatus, which comprises any display panel provided by the embodiments of the present disclosure.

At least one embodiment of the present disclosure provides a manufacture method of a display panel, the display panel has a display region and a border region surrounding the display region, the manufacture method comprises: providing a base substrate; forming a barrier structure on the base substrate, comprising: forming an organic barrier layer, in which the organic barrier layer comprises an opening passing through the organic barrier layer, and an extension direction of the opening is substantially same as an extension direction of an edge of the display panel close to the opening in the display panel; and forming an inorganic barrier layer, in which the inorganic barrier layer covers the organic barrier layer and fills the opening; and the manufacture method of the display panel further comprises: forming a peripheral circuit on the base substrate, in which the border region comprises a peripheral circuit region, and the peripheral circuit is formed in the peripheral circuit region; providing a encapsulation substrate; forming a encapsulation sealant covering the display region and the peripheral circuit region; and cell-assembling the encapsulation substrate with the base substrate to allow the encapsulation substrate to be on a side, away from the base substrate, of the barrier structure, and to allow the encapsulation sealant to be filled between the base substrate and the encapsulation substrate.

For example, the manufacture method of a display panel provided by an embodiment of the present disclosure further comprises: forming a frame sealant on the base substrate, in which the encapsulation sealant is filled in a region surrounded by the frame sealant, the base substrate, and the encapsulation substrate.

For example, in the manufacture method of a display panel provided by an embodiment of the present disclosure, the organic barrier layer is on a side, close to the display region, of the frame sealant, and the inorganic barrier layer comprises a portion between the organic barrier layer and the frame sealant.

For example, in the manufacture method of a display panel provided by an embodiment of the present disclosure, the opening comprises a first opening which is in a closed annular shape and surrounds the display region; and the first opening which is in the closed annular shape divides the organic barrier layer into an inner portion close to the display region and an outer portion away from the display region, the inner portion is in a closed annular shape and surrounds the display region, and the outer portion is in a closed annular shape and surrounds the first opening.

For example, in the manufacture method of a display panel provided by an embodiment of the present disclosure, the opening further comprises a non-annular opening spaced apart from the first opening.

For example, the manufacture method of a display panel provided by an embodiment of the present disclosure further comprises: forming a planarization layer, in which the planarization layer comprises a portion in the display region and a portion in the border region, and performing a patterning process on a material layer used to form the planarization layer, so as to use a portion, in the border region, of the planarization layer, to form the organic barrier layer.

For example, the manufacture method of a display panel provided by an embodiment of the present disclosure further comprises: forming a light-emitting device on the portion of the planarization layer in the display region.

For example, in the manufacture method of a display panel provided by an embodiment of the present disclosure, a direction from the display region to the border region is a first direction, and the forming the peripheral circuit comprises: forming a first signal wire and a function component, in which the first signal wire extends in a second direction that intersects the first direction; and an orthographic projection of the first signal wire on the base substrate is in an orthographic projection of the organic barrier layer on the base substrate, and an orthographic projection of the opening on the base substrate does not overlap with the orthographic projection of the first signal wire on the base substrate.

For example, in the manufacture method of a display panel provided by an embodiment of the present disclosure, a direction from the display region to the border region is a first direction, and the forming the peripheral circuit further comprises: forming a second signal wire extending along the first direction, in which the second signal wire comprises a first portion and a second portion connected in series with each other, the first portion is exposed by the opening, and the second portion is not exposed by the opening; and the first portion comprises at least two wires connected in parallel, and the second portion is a single wire.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

At least one embodiment of the present disclosure provides a display panel, the display panel has a display region and a border region surrounding the display region, and includes a base substrate, a peripheral circuit, and a barrier structure. The peripheral circuit is in the border region on the base substrate; the barrier structure is on the base substrate, an orthographic projection of the barrier structure on the base substrate at least partially overlaps with an orthographic projection of the peripheral circuit on the base substrate; the barrier structure includes an organic barrier layer and an inorganic barrier layer, the organic barrier layer includes an opening in the border region, the organic barrier layer is disconnected at the opening, and the inorganic barrier layer covers the organic barrier layer and fills the opening.

Figure 1:
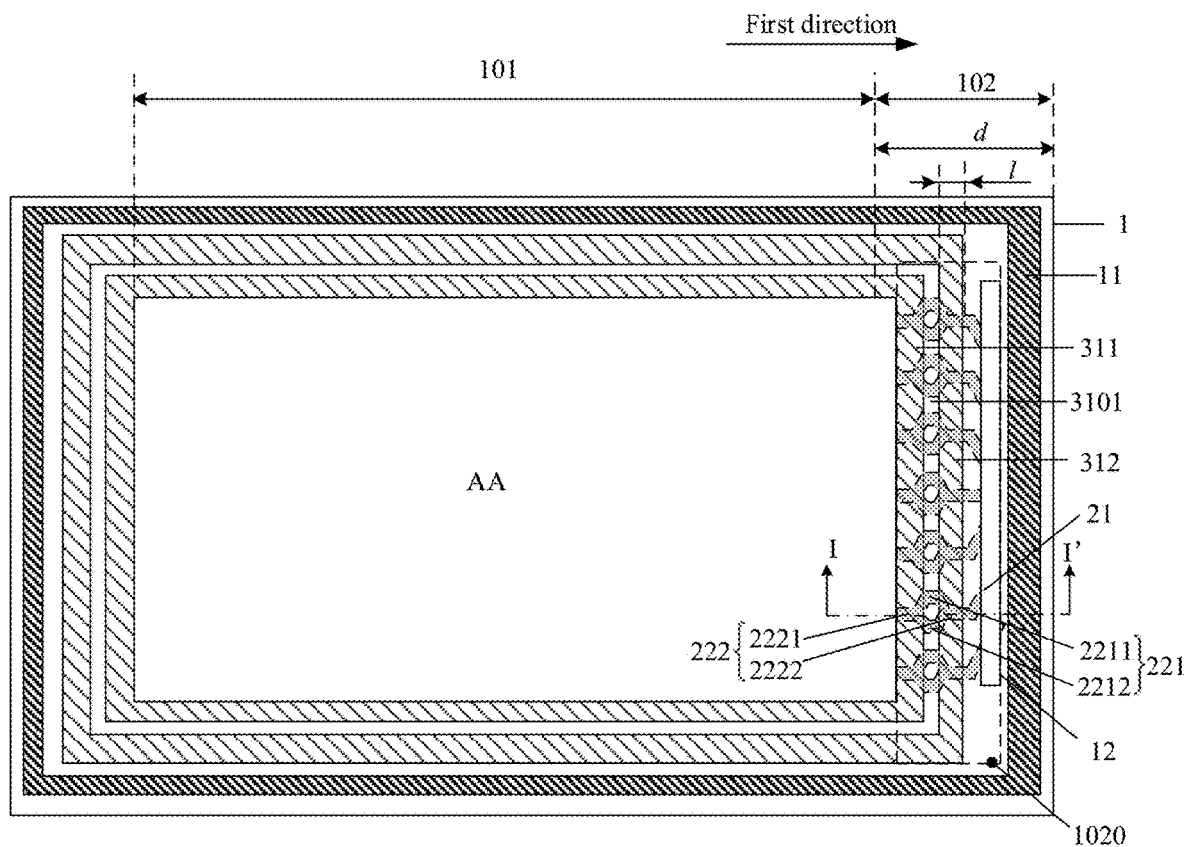
FIG. 1 is a planar diagram of a display panel provided by an embodiment of the present disclosure.
Figure 2A:
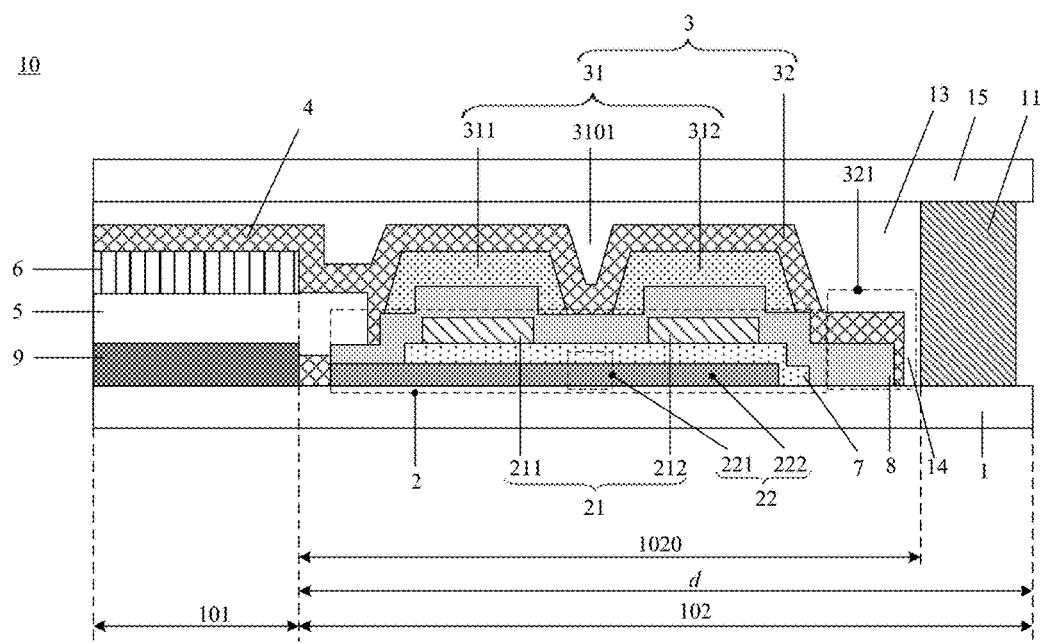
FIG. 2A is a cross-sectional diagram taken along the wire I-I' in FIG. 1.

Exemplarily, FIG. 1 is a planar diagram of a display panel provided by an embodiment of the present disclosure, and FIG. 2A is a cross-sectional diagram taken along the wire I-I' in FIG. 1. Combining FIG. 1 and FIG. 2A, the display panel 10 has a display region 101 and a border region 102 surrounding the display region 101. It should be noted that the display region 101 refers to a light-emitting region with a display function, for example, a plurality of pixel units arranged in an array are provided in the display region 101. The border region 102 refers to a non-light-emitting region, for example, the border region 102 surrounds the entire display region 101.

The display panel 10 includes a base substrate 1, a peripheral circuit 2, a barrier structure 3, an encapsulation substrate 15 and an encapsulation sealant 13. The border region 102 includes a peripheral circuit region 1020, and the peripheral circuit 2 is located on the base substrate 1 and located in the peripheral circuit region 1020. The barrier structure 3 is located on the base substrate 1, and the barrier structure 3 includes an organic barrier layer 31 and an inorganic barrier layer 32. The organic barrier layer 31 includes an opening 3101 passing through the organic barrier layer 31, and an extension direction of the opening 3101 is substantially the same as an extension direction of an edge, close to the opening, of the display panel, in the display panel. The opening 3101 is an opening located in the border region 102. The organic barrier layer 31 is disconnected at the opening 3101, that is, the opening 3101 divides the organic barrier layer 31 into a plurality of portions spaced apart from each other; the inorganic barrier layer 32 covers the organic barrier layer 31 and fills the opening 3101. The inorganic barrier layer 32 and the organic barrier layer 31 can block external moisture, oxygen, etc. from entering the display region. Organic materials have a weak barrier effect on moisture and oxygen, and inorganic materials have a strong barrier effect on moisture and oxygen. Because the opening 3101 disconnects the inorganic barrier layer 32 at the border region 102, the inorganic barrier layer 32 covers the organic barrier layer 31 and fills the opening 3101, thereby forming the inorganic barrier layer and the organic barrier layer that are alternate with each other in a direction from the border region 102 to the display region 101, so as to enhance the barrier effect of the barrier structure 3 on moisture and oxygen in a direction from the border region 102 to the display region 101. The encapsulation substrate 15 is disposed on a side, away from the base substrate 1, of the barrier structure 3; the encapsulation sealant 13 is filled between the base substrate 1 and the encapsulation substrate 15, and covers the display region 101 and the peripheral circuit region 1020.

In addition, an orthographic projection of the barrier structure 3 on the base substrate 1 at least partially overlaps with an orthographic projection of the peripheral circuit region 1020 on the base substrate 1, for example, as illustrated in FIG. 1 and FIG. 2A, a part of the orthographic projection of the barrier structure 3 on the base substrate 1 overlaps with the orthographic projection of the peripheral circuit region 1020 on the base substrate 1, and an orthographic projection of the opening 3101 on the base substrate 1 is within the orthographic projection of the peripheral circuit region 1020 on the base substrate 1, so that the barrier structure 3 at least partially overlaps with the peripheral circuit 2 in a direction perpendicular to the base substrate 1, thereby reducing the border of the display panel 10 while enhancing the barrier ability of the organic barrier layer 31 described above. For example, the peripheral circuit 2 is a driving circuit (for example, a GOA driving circuit) for providing a scanning signal for the pixel units arranged in an array in the display region 101.

It should be noted that the organic barrier layer 31 is not an frame sealant (dam sealant) for sealing. For example, the display panel further includes a frame sealant 11 which is located in the peripheral region and surrounds the barrier structure 3, and the opening 3101 of the organic barrier layer 31 is located between the frame sealant 11 and the display region 101 to better block moisture and oxygen that are not absorbed by the frame sealant 11. The frame sealant 11 is connected with the base substrate 1 and the encapsulation substrate 15, respectively, and the encapsulation sealant 13 is filled in a region surrounded by the frame sealant 11, the base substrate 1, and the encapsulation substrate 15. For example, the frame sealant 11 is a dam sealant in a "⊓" shape surrounding the barrier structure 3.

For example, the organic barrier layer 31 is located on a side, close to the display region 101, of the frame sealant 11, and the inorganic barrier layer 32 includes a portion 321 between the organic barrier layer 31 and the frame sealant 11 to achieve a better barrier effect on moisture and oxygen in a direction from the border region 102 to the display region 101.

For example, a gap 14 is provided between the inorganic barrier layer 32 and the frame sealant 11 to increase the transmission path of moisture and oxygen from the frame sealant 11 to the display region 101, and the gap 14 has a buffering effect, so as to achieve a better barrier effect on moisture and oxygen in a direction from the border region 102 to the display region 101.

Figure 2B:
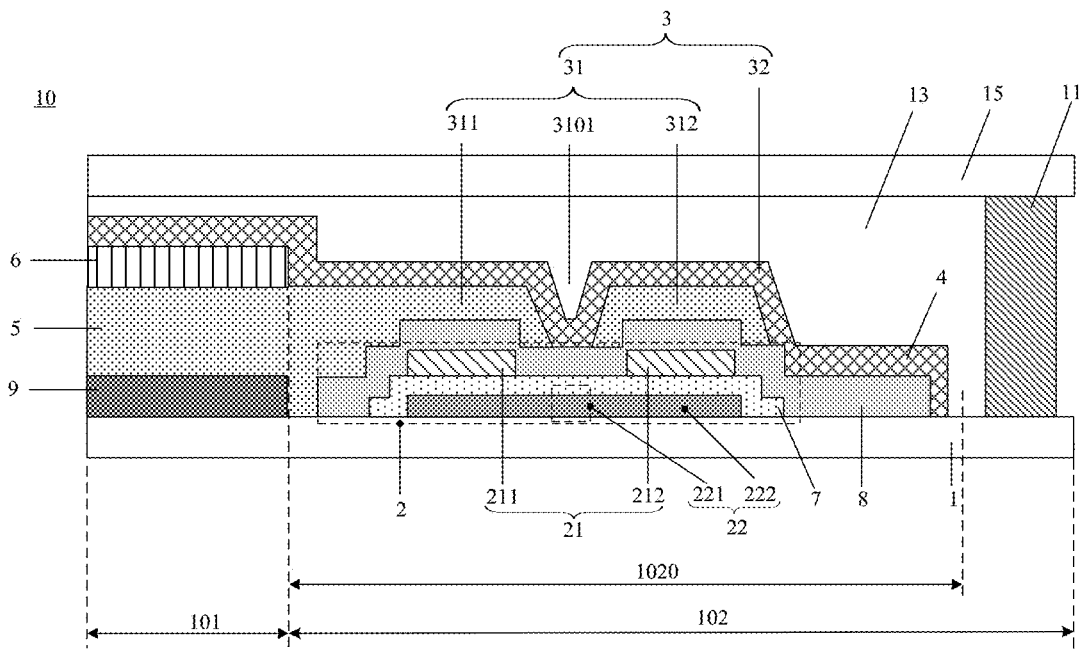
FIG. 2B is another cross-sectional diagram taken along the wire I-I' in FIG. 1.
Figure 2C:
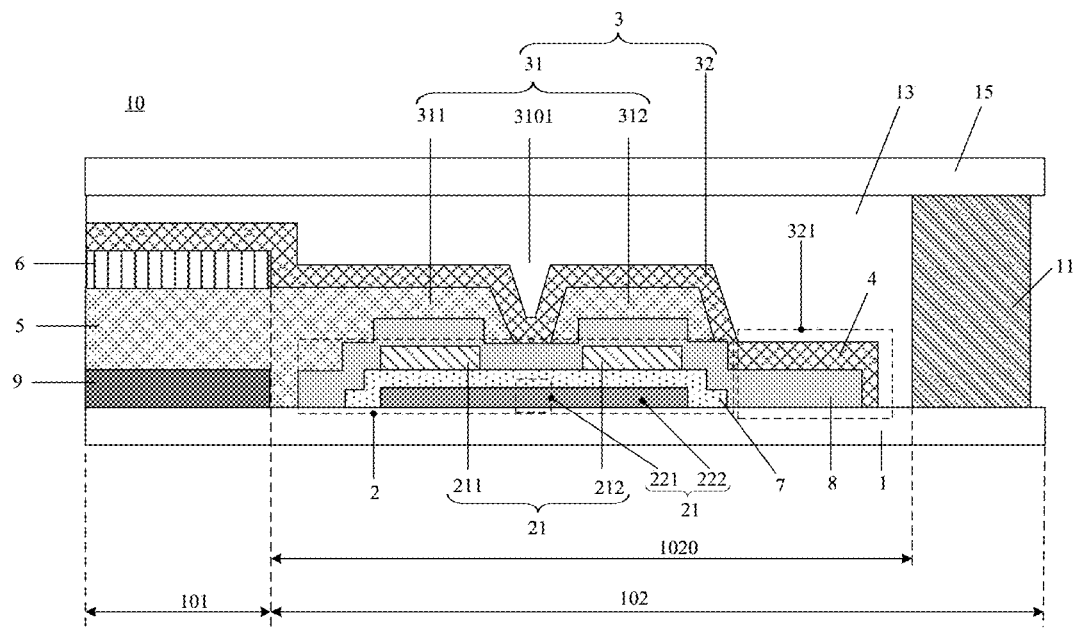
FIG. 2C is further another cross-sectional diagram taken along the wire I-I' in FIG. 1.
Figure 2D:
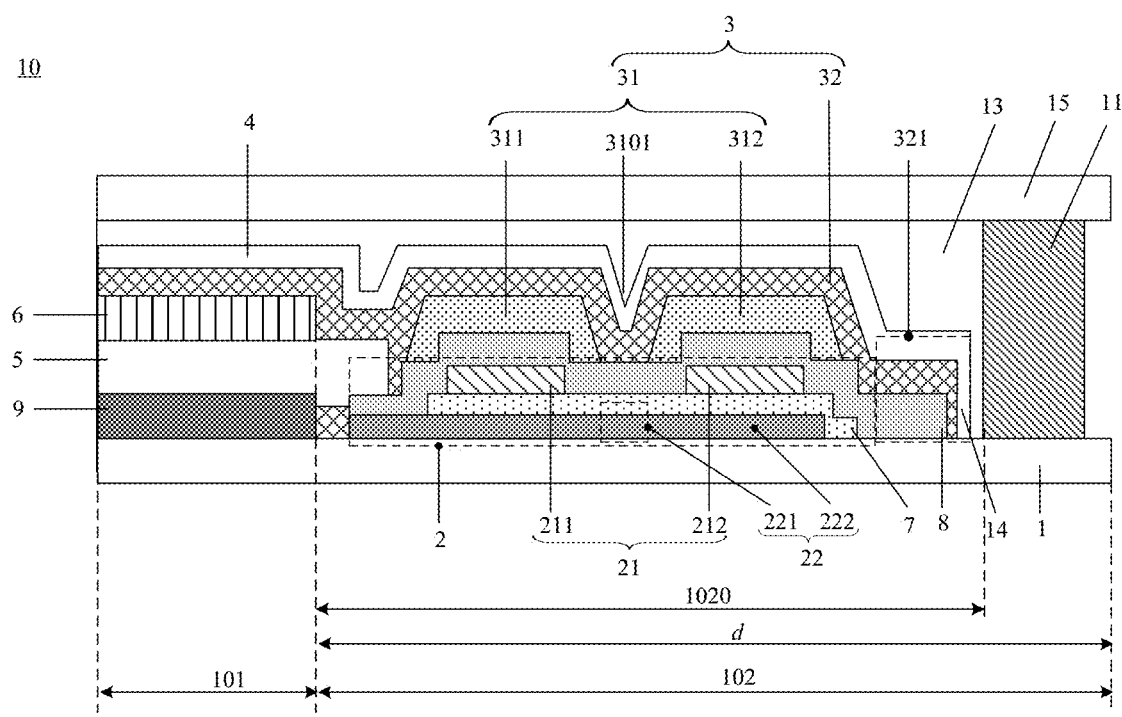
FIG. 2D is further another cross-sectional diagram taken along the wire I-I' in FIG. 1.

FIG. 2D is another cross-sectional diagram taken along the wire I-I' in FIG. 1. For example, the display panel 10 adopts a sealing mode of face seal (or dam fill). Exemplarily, as illustrated in FIG. 2D, the display panel 10 further includes an encapsulation layer 4, the encapsulation layer 4 covers the display region 101 and the inorganic barrier layer 32. The encapsulation layer 4 covers an upper surface, away from the base substrate 1, of the inorganic barrier layer 32 and a side surface, facing the frame sealant 11, of the inorganic barrier layer 32. Thus, the encapsulation layer 4 covers and seals the display region 101 and at least a part of the border region 102. For example, the encapsulation layer 4 includes an inorganic encapsulation layer. For example, in some embodiments, the encapsulation layer 4 may further include an organic encapsulation layer stacked with the inorganic encapsulation layer. Those skilled in the art may design the material structure of the encapsulation layer 4 according to conventional techniques, which is not limited in the embodiments of the present disclosure. In the case of face seal, the display panel 10 may also include a frame sealant 11 disposed around the encapsulation layer at the edge of the encapsulation layer so that the frame sealant 11 plays a role of sealing. The frame sealant 11 may further include a water-absorbing material, an oxygen-absorbing material, or the like, so as to reduce moisture and oxygen entering the display region 101 from the outside.

Other structures and technical effects of the display panel illustrated in FIG. 2D are the same as those in FIG. 2A, please refer to the descriptions of FIG. 2A.

For example, in the embodiment illustrated in FIG. 2A, the above inorganic barrier layer 32 serves as an encapsulation layer to simplify the structure of the display panel 10. For example, the inorganic barrier layer 32 covers the display region 101 and the organic barrier layer 31. For example, the inorganic barrier layer 32 covers an upper surface, away from the base substrate 1, of the organic barrier layer 31 and a side surface, facing the frame sealant 11, of the organic barrier layer 31, so that the encapsulation layer 4 has a function of sealing the display region 101 and at least a part of the border region 102.

For example, as illustrated in FIG. 1, the opening 3101 is in a closed annular shape that surrounds the display region 101, that is, the opening includes a first opening which is in a closed annular shape and surrounds the display region, and the first opening is the opening 3101. The first opening 3101 which is in the closed annular shape divides the organic barrier layer 31 into an inner portion 311 close to the display region 101 and an outer portion 312 away from the display region 101, the inner portion 311 is in a closed annular shape and surrounds the display region 101, and the outer portion 312 is in a closed annular shape and surrounds the first opening 3101. In this way, a tight sealing effect can be achieved, thereby enhancing the barrier effect of the barrier structure on moisture and oxygen in a direction from the border region 102 to the display region 101 at various positions around the display region 101.

For example, a width l of the first opening 3101 in a direction from the border region to the display region ranges from 1 μm to 5000 μm. Those skilled in the art can design according to the actually required width of the border region of the display panel.

For example, in the embodiment illustrated in FIG. 2A, the display panel 10 further includes a planarization layer 5, the planarization layer 5 includes a portion located in the display region 101 and a portion located in the border region 102, and the portion of the planarization layer 5 in the display region 101 provides a flat surface to facilitate the formation of light-emitting devices on the flat surface. For example, the display panel 10 further includes a light-emitting device 6 located in the display region 101 and located on the portion, in the display region 101, of the planarization layer 5. For example, the light-emitting device 6 is an electroluminescent device, such as an OLED light-emitting device, a micro LED light-emitting device, etc. The light-emitting device 6 includes an anode, a light-emitting layer and a cathode in a direction perpendicular to the base substrate 1. For example, the cathode is a single layer, and the material of the single-layer cathode is aluminum (Al), magnesium/silver (Mg: Ag, that is, a stacked magnesium film and silver film), indium tin oxide (IZO), aluminum doped zinc oxide (AZO), etc. For example, the cathode may also include a plurality of layers stacked in a direction perpendicular to the base substrate 1. For example, the cathode includes a transparent conductive layer and a transparent metal film stacked in the direction perpendicular to the base substrate 1. The material of the transparent conductive layer is IZO, AZO, or the like, and the material of the transparent metal film is Ag, Mg: Ag, or the like. For example, the display panel 10 further includes a pixel driving circuit 9 located in the display region 101 for controlling the light-emitting state of the pixel unit, and the driving circuit 9 may be designed according to conventional techniques.

For example, the material of the planarization layer 5 is a resin material, a photoresist material, etc. The thickness of the planarization layer 5 in the direction perpendicular to the base substrate 1 ranges from 0.2 μm to 3 μm. Of course, the material and thickness of the planarization layer 5 are only illustrative. The embodiments of the present disclosure are not limited in this aspect, and the material and thickness may be selected according to requirements.

Of course, the encapsulation layer 4 is not limited to the case that the encapsulation layer 4 includes only one inorganic barrier layer 32, for example, the encapsulation layer 4 includes other organic encapsulation layer(s) and other inorganic encapsulation layer(s) stacked with the inorganic barrier layer 32 in the direction perpendicular to the base substrate 1. Those skilled in the art can design according to conventional techniques.

FIG. 2B is another cross-sectional diagram taken along the wire I-I' in FIG. 1. For example, in the embodiment illustrated in FIG. 2B, the above planarization layer 5 serves as the organic barrier layer 31, that is, a patterning process is performed on the material layer used to form the planarization layer 5 to form the organic barrier layer 31 having the opening without additional forming of the organic barrier layer 31, thereby simplifying the structure and manufacture process of the display panel 10.

Other features of the embodiment illustrated in FIG. 2B are the same as those in FIG. 2A, and reference may be made to the descriptions of FIG. 2A.

As illustrated in FIG. 1 and FIG. 2A, a direction from the display region 101 to the border region 102 is a first direction (for example, the direction indicated by the arrow in FIG. 1), the peripheral circuit 2 further includes a first signal wire 21 and a function device (not illustrated in the figure), the first signal wire 21 extends in a second direction that intersects the first direction. The function device includes, for example, a thin film transistor, a capacitor, and the like. For example, the second direction is perpendicular to the first direction, for example, the first signal wire 21 extends along an edge of the display panel 10. An orthographic projection of the first signal wire 21 on the base substrate 1 is within an orthographic projection of the organic barrier layer 31 on the base substrate 1, and an orthographic projection of the opening (such as the first opening 3101) on the base substrate 1 does not overlap with the orthographic projection of the first signal wire 21 on the base substrate 1. That is, the first signal wire 21 does not overlap with the above opening in a direction perpendicular to the base substrate 1, and the entire first signal wire 21 is not exposed by the first opening 3101. For example, for an OLED display panel, especially for a large-size OLED display panel, in the processes, such as the evaporation process, sputtering process, chemical deposition (CVD) process, etc., of the light-emitting layer or the metal film layers used for forming circuit wires or electrodes of light-emitting devices, a mask is required, during the film formation process using the mask, it is easy to cause the metal wires (such as the first signal wire 21) of the peripheral circuit in the region between the display region and the frame sealant to be scratched, therefore, if the first signal wire 21 is provided at a position corresponding to the above opening, the first signal wire 21 may be easily damaged during the manufacture process of the display panel 10, which may cause display defects such as signal short circuit. In order to reduce or avoid the scratching of the metal wires of the peripheral circuit such as the first signal wire 21, in the embodiments of the present disclosure, because the organic barrier layer 31 covers the first signal wire 21 in the direction perpendicular to the base substrate 1, and the orthographic projection of the first opening 3101 on the base substrate 1 does not overlap with the orthographic projection of the first signal wire 21 on the base substrate 1, the organic barrier layer 31 can further protect the first signal wire 21, and prevent the first signal wire 21 being disposed at the opening to cause the first signal wire 21 to be damaged or broken, thereby avoiding the above problem that the first signal wire 21 is easily damaged during the manufacture process of the display panel 10.

For example, as illustrated in FIG. 2A, the peripheral circuit 2 includes a plurality of the first signal wires 21, the plurality of the first signal wires 21 are disposed in the same layer, and a gap is provided between two adjacent first signal wires (taking adjacent first signal wires 211 and 212 in FIG. 2A as an example) of the plurality of the first signal wires 21, and the orthographic projection of the opening (for example, the first opening 3101) on the base substrate 1 is within the orthographic projection of the gap between the two adjacent signal wires 211 and 212 on the base substrate 1, so that the opening solves the above problem that the signal wire 21 is easily damaged in the manufacture process of the display panel 10 while playing the role of preventing the moisture, oxygen, etc. from entering the display region as described above while.

For example, the display panel 10 further includes a protection layer 8, the protection layer 8 covers the first signal wire 21 and is located between the first signal wire 21 and the organic barrier layer 31 to further protect the first signal wire 21, and meanwhile, the protection layer 8 plays a role of preventing the moisture and oxygen from entering the display region. For example, the material of the protection layer 8 is an organic material such as resin, etc.

For example, the protection layer 8 is located in the border region 102, and a gap is provided between the protection layer 8 and the display region 101, and the inorganic barrier layer 32 covers the protection layer 8. The protection layer 8 may be provided separately, or may be provided in the same layer and made of the same material as an insulation layer in the display region 101 (for example, an interlayer insulation layer in the pixel circuit of the display region, etc.), that is, the insulation layer in the display region 101 is used to form the protection layer 8, so as to simplify the manufacture process and manufacture difficulty of the display panel 10.

For example, as illustrated in FIG. 1 and FIG. 2A, the peripheral circuit 2 includes a second signal wire 22 extending from the display region 101 to the border region 102 along the first direction; the second signal wire 22 includes a first portion 221 and a second portion 222 connected in series with each other, the first portion 221 is exposed by the above opening (for example, the first opening 3101), and the second portion 222 is not exposed by the opening, that is, an orthographic projection of the first portion 221 on the base substrate 1 overlaps with and an orthographic projection of the first opening 3101 on the base substrate 1, and an orthographic projection of the second portion 222 on the base substrate 1 does not overlap (no overlapping portion exits) with the orthographic projection of the first opening 3101 on the base substrate 1. The first portion 221 includes at least two wires connected in parallel, and the second portion is a single wire. For example, in FIG. 1, the first portion 221 includes two wires 2211 and 2212 connected in parallel, and the second portion 222 includes a first section 2221 and a second section 2222, at a position corresponding to the inner portion 311 of the organic barrier layer 31, the first section 2221 is a single wire; at a position corresponding to the first opening 3101, the second signal wire 22 is divided into two parallel wires 2211 and 2212, the two wires 2211 and 2212 are both connected to the first section 2221 in series; at a position corresponding to the outer portion 312 of the organic barrier layer 31, the two wires 2211 and 2212 are merged into a single wire again, that is, merged into the second section 2222. In the manufacture process of the display panel 10, the second signal wire 22 overlapping with the orthographic projection of the first opening 3101 on the base substrate 1 is easily broken or damaged, therefore, the first portion 221 including at least two wires connected in parallel can avoid the problem that the signal wire exposed by the first opening 3101 is easily damaged.

In other embodiments, the second signal wire 22 may further include a portion located in the display region 101, the portion is formed integrally with the gate wire in the display region 101, and the gate wire belongs to a part of the second signal wire 22. For another example, the second signal wire 22 is electrically connected to the gate wire in the display region 101.

Referring to FIG. 2A, the display panel 10 further includes an insulation layer 7 located between the first signal wire 21 and the second signal wire 22 to insulate the first signal wire 21 from the second signal wire 22.

For example, in the embodiment illustrated in FIG. 2A, the first signal wire 21 is located on a side, away from the base substrate 1, of the second signal wire 21. Of course, in other embodiments, the first signal wire 21 may be located on a side, close to the base substrate 1, of the first signal wire 21.

The first signal wire 21 may be a signal wire having any function. For example, the peripheral circuit 2 is a gate driving circuit (GOA driving circuit), and for example, the first signal wire 21 is a clock signal wire in the GOA driving circuit.

Figure 2E:
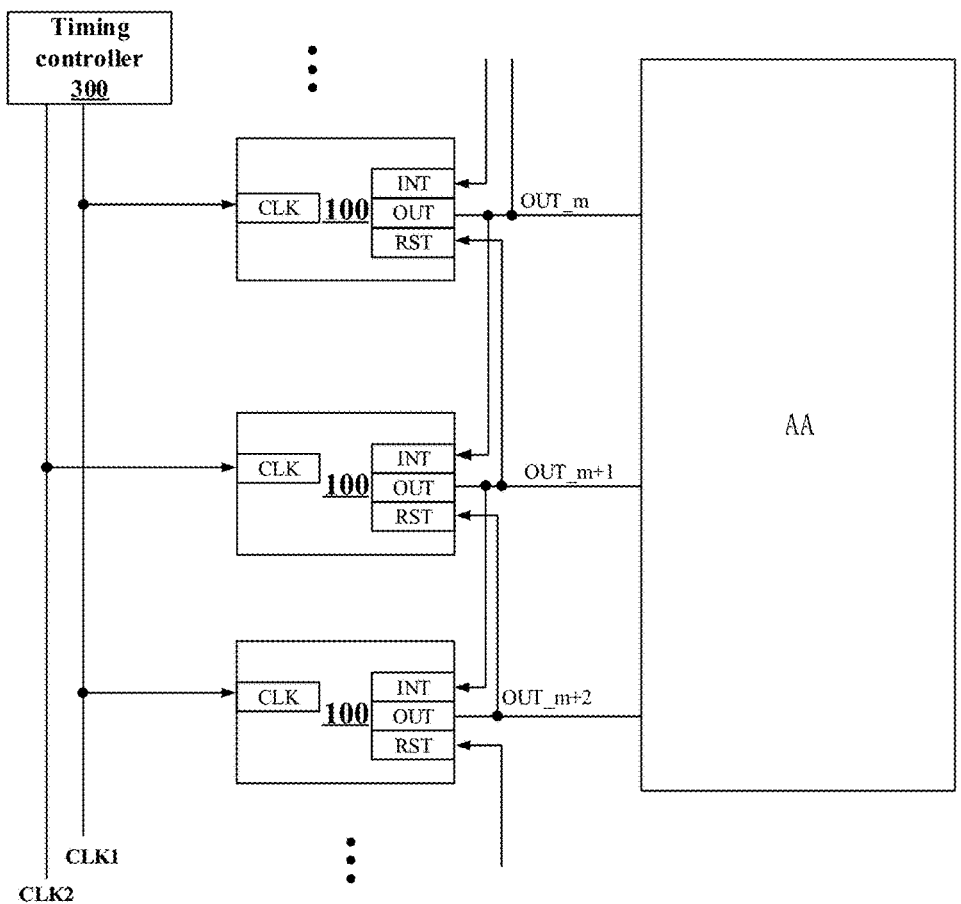
FIG. 2E is a schematic diagram of a peripheral circuit provided by an embodiment of the present disclosure.

Exemplarily, FIG. 2E is a schematic diagram of a peripheral circuit provided by an embodiment of the present disclosure. As illustrated in FIG. 2E, the gate driving circuit 2 includes a plurality of cascaded shift register units 100, any one or more shift register units 100 may adopt a structure or the variants of the shift register unit 100 provided by any embodiment of the present disclosure. For example, the gate driving circuit 2 may be directly integrated on the array substrate of the display apparatus by using the same semiconductor manufacture process as the thin film transistor to realize a function of progressive scanning driving or a function of interlaced scanning driving.

Except for the shift register unit of the first stage, the input terminal INT of each of the shift register units of the remaining stages is connected to the output terminal OUT of the shift register units of the respective previous stage; and except for the shift register unit of the last stage, the reset terminal RST of the shift register unit of each of the remaining stages is connected to the output terminals OUT of the shift register units of the respective next stages.

As illustrated in FIG. 2E, the gate driving circuit 2 further includes a first clock signal wire CLK1 and a second clock signal wire CLK2. For example, the first signal wire 21 includes the first clock signal wire CLK1 and the second clock signal wire CLK2. For example, the first clock signal wire CLK1 and the second clock signal wire CLK2 are respectively connected to clock signal terminals CLK of the plurality of cascaded shift register units to provide clock signals. For example, the reset control signal includes clock signals provided by the first clock signal wire CLK1 and the second clock signal wire CLK2. It should be noted that the gate driving circuit 2 may include four, six, eight or more clock signal wires. The number of the clock signal wires depends on the specific situations, and the embodiments of the present disclosure are not limited in this aspect. The first signal wire 21 may include the four, six, eight or more clock signal wires.

For example, as illustrated in FIG. 2E, each of the shift register units further includes a clock signal terminal CLK which is configured to be connected to the first clock signal wire CLK1 or the second clock signal wire CLK2 to receive a first clock signal or a second clock signal. The first clock signal wire CLK1 is connected to the clock signal terminal CLK of the shift register unit of the (2n−1) th (n is an integer larger than 0) stage, and the second clock signal wire CLK2 is connected to the clock signal terminal CLK of the shift register unit of the 2n th stage. It should be noted that the embodiments of the present disclosure include but are not limited to the above connection methods. For example, the following connection method is adopted in at least one embodiment: the first clock signal wire CLK1 is connected to the clock signal terminal CLK of the shift register unit of the 2n th stage, and the second clock signal wire CLK2 is connected to the clock signal terminal CLK of the shift register unit of the (2n−1) th stage.

It should be noted that OUT_m (m is an integer larger than 0) illustrated in FIG. 2E represents the output terminal of the shift register unit of the m th stage, OUT_m+1 represents the output terminal of the shift register unit of the (m+1) th stage, OUT_m+2 represents the output terminal of the shift register unit of the (m+2) th stage, . . . . The reference numerals in the following embodiments are similar to this, and are not be repeated again.

For example, the input terminal INT of the shift register unit of the first stage is configured to receive a trigger signal STV, and the reset terminal RST of the shift register unit of the final stage is configured to receive the reset signal. For simplicity, the trigger signal STV and the reset signal are not illustrated in FIG. 2E.

For example, the gate driving circuit 2 further includes a first voltage wire, a second voltage wire, a third voltage wire, and a fourth voltage wire (not illustrated in the figure). For example, the first voltage wire is connected to a first voltage terminal VDD and is configured to provide a first voltage; the second voltage wire is connected to a second voltage terminal VSS and is configured to provide a second voltage; the third voltage wire is connected to a third voltage terminal VGH1 and is configured to provide a third voltage; and the fourth voltage wire is connected to a fourth voltage terminal VGH2 and is configured to provide a fourth voltage.

For example, the first signal wire is the above first voltage wire or second voltage wire.

For example, as illustrated in FIG. 2E, the gate driving circuit 2 further includes a timing controller 300. For example, the timing controller 300 is configured to be connected to the first clock signal wire CLK1 and the second clock signal wire CLK2 to provide a clock signal to each shift register unit; the gate driving circuit 10 may also be configured to be connected to the first voltage wire, the second voltage wire, the third voltage wire, and the fourth voltage wire to respectively provide the first voltage to the fourth voltage to each shift register unit 100. For example, the timing controller 300 may also be configured to provide the trigger signal STV and the reset signal.

For example, the pixel circuit of each pixel unit of the display region includes a display signal wire (a data wire) configured to provide a signal for controlling display gray scale for the light-emitting device, and the peripheral circuit may further include a portion of the display signal wire extending to the peripheral circuit region, and the first signal wire may also be the portion of the signal wire extending to the peripheral circuit region.

For example, the second signal wire 22 is a scanning signal wire for providing scanning signals to the pixel units arranged in an array in the display region 101, the second signal wire 22 is connected to the gate wire in the display region 101, and is integrate with the gate wire. The second signal wire 22 has a bent portion in the border region, and the bent portion is connected to another part 12 of the gate driving circuit, for example, the another part 12 is a scan signal integrated chip. For example, as illustrated in FIG. 2E, the second signal wire 22 includes the m th stage scan signal wire extending from the output terminal OUT_m (m is an integer larger than 0) of the shift register unit of the m-th stage to the display region (AA), the (m+1) th stage scan signal wire extending from the output terminal OUT_m+1 of the shift register unit of the (m+1) th stage to the display region, and the (m+2) th stage scanning signal wire extending from the output terminal OUT_m+2 of shift register unit of the (m+2) th stage to the display region, . . .

. . The embodiments of the present disclosure do not limit the number of scanning signal wires included in the second signal wire 22.

For example, the first signal wire 21 and the second signal wire 22 are metal wires.

For example, in the embodiment illustrated in FIG. 2A, the width d of the border region 102 in the first direction is smaller than 5 mm, thereby achieving a narrow border. In this case, through the cooperation of the organic barrier layer 31 including the opening and the inorganic barrier layer 32, the above better barrier effect on moisture and oxygen is also achieved.

For example, in another embodiment of the present disclosure, the width d of the border region 102 in the first direction is larger than or equal to 5 mm. By increasing the width of the border region 102, the transmission path of moisture and oxygen to the display region 101 is increased, thereby achieving a better barrier effect on moisture and oxygen in the direction from the border region 102 to the display region 101. The width of the border region 102 in the first direction may be determined according to requirements, which is not limited in the embodiments of the present disclosure.

For example, in the embodiments of the present disclosure, the material of the organic barrier layer 31 is an organic material such as resin, and the material of the organic barrier layer 31 includes an oxygen-absorbing material or a water-absorbing material. For example, the material of the inorganic barrier layer 32 includes at least one selected from a group consisting of silicon oxide, silicon nitride, or silicon oxynitride. The material of the organic barrier layer 31 and the material of the inorganic barrier layer 32 are not limited to the types listed above, and the materials are not limited in the embodiments of the present disclosure.

FIG. 2C is another cross-sectional diagram taken along the wire I-I' in FIG. 1. For example, in the embodiment illustrated in FIG. 2C, the display panel 10 may also be encapsulated by using the frame sealant 11, the encapsulation frame 13 and the encapsulation substrate 15. The encapsulation substrate 15 is opposite to the base substrate 1, and the frame sealant 11 bonds the encapsulation substrate 15 and the base substrate 1 to each other. The encapsulation frame 13 is filled between the inorganic barrier layer 4 and the encapsulation substrate 15. The encapsulation frame 13 includes a water-absorbing material, an oxygen-absorbing material, a heat insulating material, or the like, so as to prevent the light-emitting device 6 of the display region 101 from being damaged by external moisture, oxygen or heat.

Other features of the embodiment illustrated in FIG. 2C are the same as those in FIG. 2A, and may be referred to the descriptions of FIG. 2A.

Figure 3:
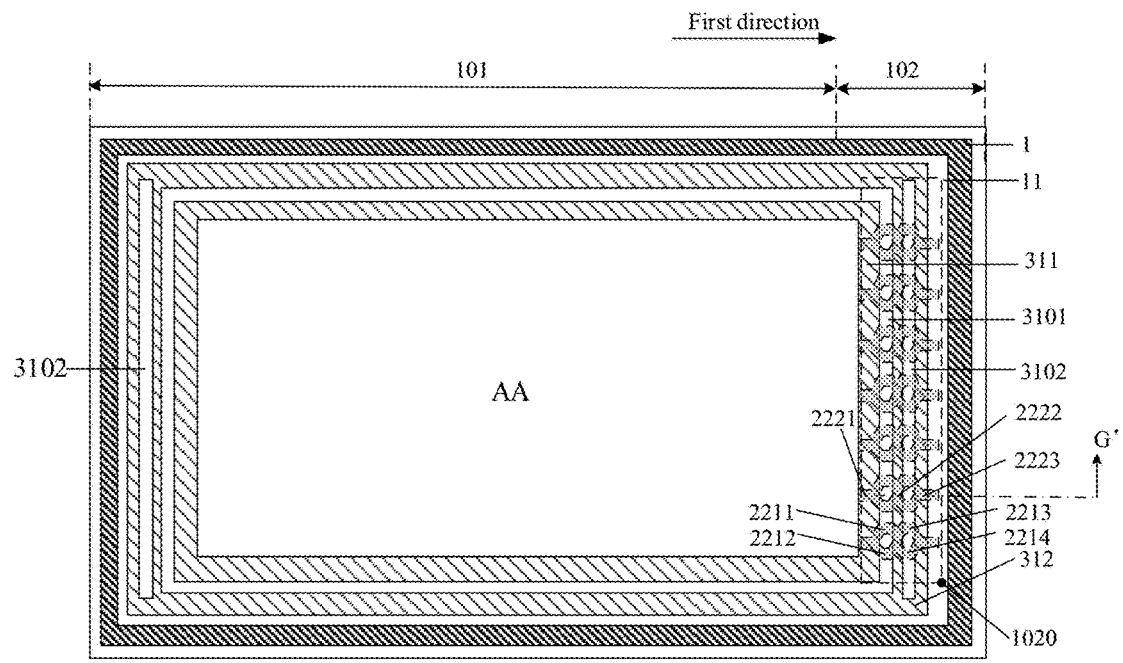
FIG. 3 is a planar diagram of a display panel provided by an embodiment of the present disclosure.
Figure 4:
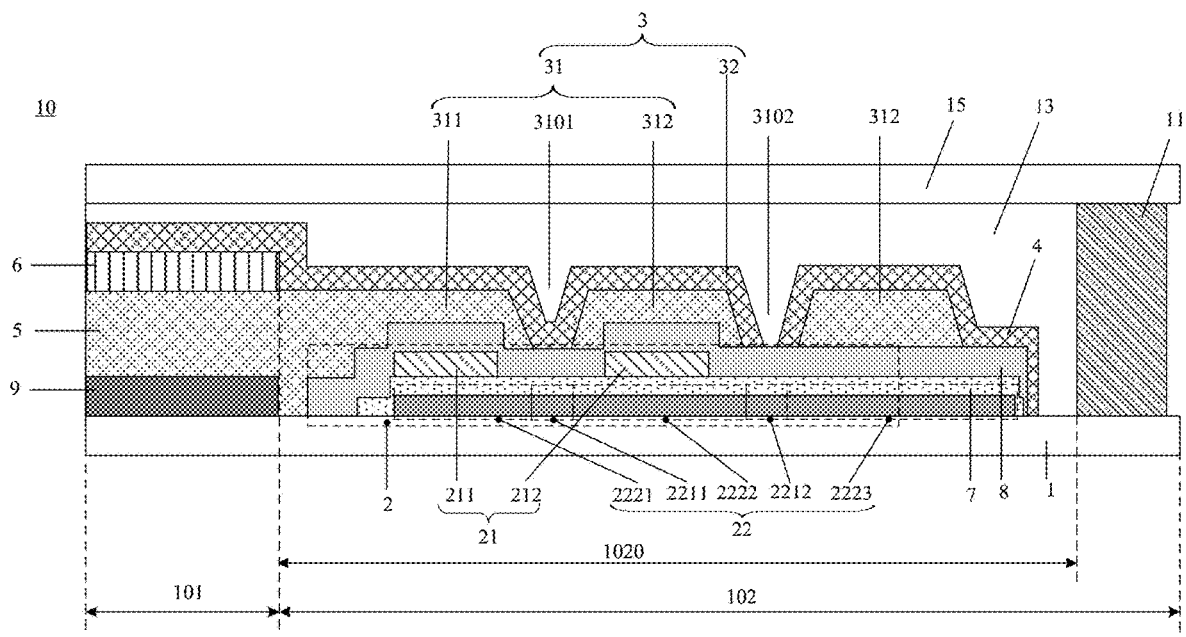
FIG. 4 is a cross-sectional diagram taken along a wire G-G' in FIG. 3.

FIG. 3 is a planar diagram of a display panel provided by an embodiment of the present disclosure, and FIG. 4 is a cross-sectional diagram taken along the wire G-G' in FIG. 3. As illustrated in FIG. 3 and FIG. 4, the display panel 10 has the following differences from the display panel illustrated in FIG. 2A. The organic barrier layer 31 includes a plurality of the openings located in the border region 102. For example, the opening includes the above first opening 3101 and a non-annular opening 3102 spaced apart from the first opening 3101. The non-annular opening 3102 is located in the outer portion 312 of the organic barrier layer 31 or the inner portion 311 of the organic barrier layer 31. For example, in this embodiment, the case that the non-annular opening 3102 is located in the outer portion 312 of the organic barrier layer 31 is taken as an example. In other embodiments, the non-annular opening may be provided in the inner portion 311, or the non-annular opening may be provided in both the inner portion 311 and the outer portion 312.

As illustrated in FIG. 4, the first portion 221 of the second signal wire 22 includes a first segment and a second segment. The first segment and the second segment are respectively exposed by the first opening 3101 and the non-annular opening 3101. The second portion 222 of the second signal wire 22 includes a first section 2221, a second section 2222, and a third section 2223 that are not exposed by the first opening 3101 and the non-annular opening 3102. That is, an orthographic projection of the first segment on the base substrate 1 overlaps with an orthographic projection of the first opening 3101 on the base substrate 1, and an orthographic projection of the second segment on the base substrate 1 overlap with an orthographic projection of the non-annular opening 3102 on the base substrate, orthographic projections of the first section 2221, the second section 2222 and the third section 2223 on the base substrate 1 do not overlap (no overlapping portion exists) with the orthographic projection of the first opening 3101 on the base substrate 1 and the orthographic projection of the non-annular opening 3102 on the base substrate 1. Referring to FIG. 3 and FIG. 4, both the first segment and the second segment include at least two wires connected in parallel. The first section 2221, the second section 2222, and the third section 2223 of the second portion 22 are all single wires. The first segment of the first section 221 includes two wires 2211 and 2212 connected in parallel, and the second segment of the first section 221 includes two wires 2213 and 2214 connected in parallel. The first section 2221, the first segment of the first section 221 including the two wires 2211 and 2212, the second section 2222, the second segment of the first section 221 including the two wires 2213 and 2214, and the third section 2223 are successively connected in series with each other. The technical effect of this design refers to the above descriptions.

At least one embodiment of the present disclosure further provides a display apparatus, the display apparatus includes any display panel provided by the embodiments of the present disclosure.

Figure 5:
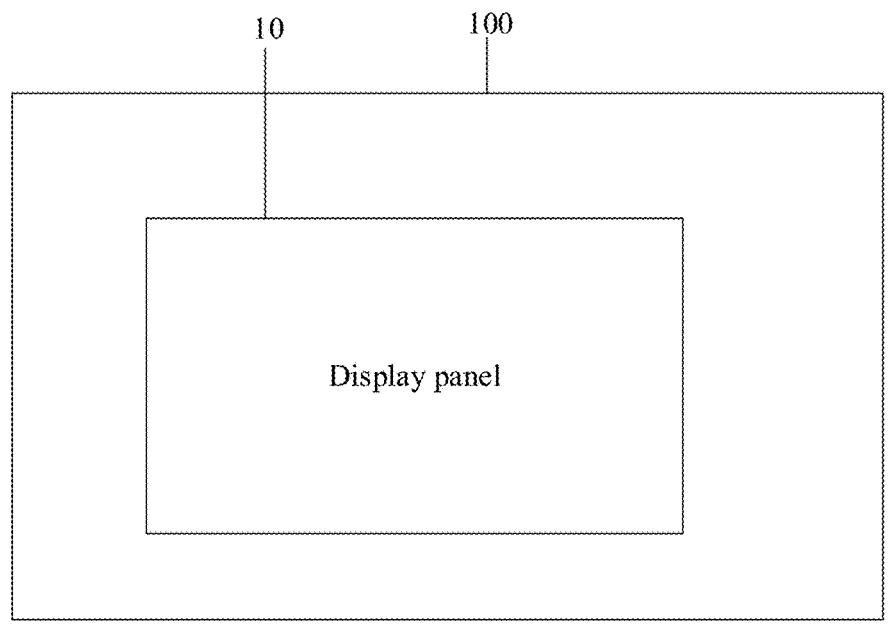
FIG. 5 is a schematic diagram of a display apparatus provided by an embodiment of the present disclosure.

Exemplarily, FIG. 5 is a schematic diagram of a display apparatus provided by an embodiment of the present disclosure. As illustrated in FIG. 5, the display apparatus 100 includes any display panel 10 provided by the embodiments of the present disclosure. The display apparatus 100 is, for example, an OLED display apparatus or a micro LED display apparatus. For example, the display apparatus 100 is any device with a display function such as a mobile phone, a tablet computer, a TV, a notebook computer, a digital photo frame, a navigator, and the like. Other structures of the display apparatus 100 other than the display panel can be designed by those skilled in the art according to specific requirements and conventional techniques in the art.

At least one embodiment of the present disclosure provides a manufacture method of a display panel, the display panel has a display region and a border region surrounding the display region, the manufacture method includes: providing a base substrate; forming a barrier structure on the base substrate, including: forming an organic barrier layer, in which the organic barrier layer comprises an opening passing through the organic barrier layer, and an extension direction of the opening is substantially same as an extension direction of an edge, close to the opening, of the display panel, in the display panel; and forming an inorganic barrier layer, in which the inorganic barrier layer covers the organic barrier layer and fills the opening; and the manufacture method of the display panel further includes: forming a peripheral circuit on the base substrate, in which the border region includes a peripheral circuit region, and the peripheral circuit is formed in the peripheral circuit region; providing an encapsulation substrate; forming an encapsulation sealant covering the display region and the peripheral circuit region; and cell-assembling the encapsulation substrate with the base substrate, so as to allow the encapsulation substrate to be on a side, away from the base substrate, of the barrier structure, and to allow the encapsulation sealant to be filled between the base substrate and the encapsulation substrate.

Inorganic barrier layer and organic barrier layer that are alternate can be formed in a direction from the border region to the display region by the manufacture method, so as to increase the barrier structure's ability of blocking moisture and oxygen in the direction from the border region to the display region.

For example, in one embodiment, the manufacture method of the display panel 10 illustrated in FIG. 1 and FIG. 2A further includes: forming a frame sealant 11 on the base substrate 1. The frame sealant 11 is in the peripheral region of the border region 102, and the opening 3101 of the organic barrier layer 31 is between the frame sealant 11 and the display region 101. For example, the organic barrier layer 31 is on a side, close to the display region 101, of the frame sealant 11, and the inorganic barrier layer 32 includes a portion 321 which is between the organic barrier layer 31 and the frame sealant 11.

For example, as illustrated in FIG. 1, the formed opening 3101 is in a closed annular shape surrounding the display region 101, that is, the opening includes a first opening which is in a closed annular shape and surrounds the display region, and the first opening is the opening 3101. The first opening 3101 which is in the closed annular shape divides the organic barrier layer 31 into an inner portion 311 close to the display region 101 and an outer portion 312 away from the display region 101. The inner portion 311 is in a closed annular shape and surrounds the display region 101, and the outer portion 312 is in a closed annular shape and surrounds the first opening 3101. In this way, a tight sealing effect can be achieved, thereby enhancing the barrier effect of the barrier structure on moisture and oxygen in the direction from the border region 102 to the display region 101 at various positions around the display region 101.

For example, the manufacture method of the display panel 10 illustrated in FIG. 2B includes: forming a planarization layer 5, the planarization layer 5 includes a portion located in the display region 101 and a portion located in the border region 102, and the portion of the planarization layer 5 in the display region 101 provides a flat surface, which is beneficial to the formation of the light-emitting device 6 on the flat surface. The planarization layer 5 is used as the organic barrier layer 31, that is, a patterning process is performed on the material layer for forming the planarization layer 5 to form the organic barrier layer 31 with the opening without additionally forming the organic barrier layer 31, thereby simplifying the manufacture process of the display panel 10.

For example, the manufacture method of the display panel further includes forming a light-emitting device 6 on the portion of the planarization layer 5 in the display region 101. For example, the light-emitting device 6 is an electroluminescent device, such as an OLED light-emitting device, a micro LED light-emitting device, etc. The light-emitting device 6 includes an anode, a light-emitting layer and a cathode in a direction perpendicular to the base substrate 1. For example, the display panel 10 further includes a pixel driving circuit 9 located in the display region 101 for controlling the light-emitting state of the pixel unit, which can be designed by those skilled in the art according to conventional techniques.

The manufacture method of the display panel further includes providing a encapsulation substrate 15; forming an encapsulation sealant 13 covering the display region 101 and the peripheral circuit region 102; and cell-assembling the encapsulation substrate 15 with the base substrate 1, so that the encapsulation substrate 15 is on a side, away from the base substrate 1, of the barrier structure 31, and the encapsulation sealant 13 is filled between the base substrate 1 and the encapsulation substrate 15. The frame sealant 11 is connected with the base substrate 1 and the encapsulation substrate 15, respectively, and the encapsulation sealant 13 is filled in a region surrounded by the frame sealant 11, the base substrate 1 and the encapsulation substrate 15.

As illustrated in FIG. 1 and FIG. 2A, a direction from the display region 101 to the border region 102 is a first direction (for example, the direction indicated by the arrow in FIG. 1), forming the peripheral circuit 2 includes: forming a first signal wire 21 and a function device (not illustrated in the figure), the first signal wire 21 extends in a second direction that intersects the first direction. The function device includes, for example, a thin film transistor, a capacitor, and the like. For example, the second direction is perpendicular to the first direction, for example, the first signal wire 21 extends along an edge of the display panel 10. An orthographic projection of the first signal wire 21 on the base substrate 1 is in an orthographic projection of the organic barrier layer 31 on the base substrate 1, and an orthographic projection of the opening (such as the first opening 3101) on the base substrate 1 does not overlap with the orthographic projection of the first signal wire 21 on the base substrate 1. That is, the first signal wire 21 does not overlap with the above opening in a direction perpendicular to the base substrate 1, and the first signal wire 21 is not exposed by the above opening. For example, for an OLED display panel, especially for a large-size OLED display panel, in the processes, such as the evaporation process, sputtering process, chemical deposition (CVD) process, etc., of the light-emitting layer or the metal film layers used for forming circuit wires or electrodes of light-emitting devices, a mask is required, during the film formation process using the mask, it is easy to cause the metal wires (such as the first signal wire 21) of the peripheral circuit in the region between the display region and the frame sealant to be scratched, therefore, if the first signal wire 21 is provided at a position corresponding to the above opening, the first signal wire 21 may be easily damaged during the manufacture process of the display panel 10, which may cause display defects such as signal short circuit. In order to reduce or avoid the scratching of the metal wires of the peripheral circuit such as the first signal wire 21, in the embodiments of the present disclosure, because the organic barrier layer 31 covers the first signal wire 21 in the direction perpendicular to the base substrate 1, and the orthographic projection of the first opening 3101 on the base substrate 1 does not overlap with the orthographic projection of the first signal wire 21 on the base substrate 1, the organic barrier layer 31 can further protect the first signal wire 21, and prevent the first signal wire 21 from being damaged or broken caused by disposing the first signal wire 21 at the opening, thereby avoiding the above problem that the first signal wire 21 is easily damaged during the manufacture process of the display panel 10.

For example, as illustrated in FIG. 2A, forming the peripheral circuit 2 includes forming a plurality of the first signal wires 21, the plurality of the first signal wires 21 are disposed in the same layer, and a gap is formed between two adjacent first signal wires (taking adjacent first signal wires 211 and 212 in FIG. 2A as an example) of the plurality of the first signal wires 21, and the orthographic projection of the opening (for example, the first opening 3101) on the base substrate 1 is in the orthographic projection of the gap between the two adjacent signal wires 211 and 212 on the base substrate 1, so that the opening functions while solving the above problem that the first signal wire 21 is easily damaged in the manufacture process of the display panel 10.

For example, as illustrated in FIG. 2A, the manufacture method of the display panel 10 further includes forming a protection layer 8, the protection layer 8 covers the first signal wire 21 and is between the first signal wire 21 and the organic barrier layer 31 to further protect the first signal wire 21, and meanwhile, the protection layer 8 has an effect of blocking moisture and oxygen. For example, the material of the protection layer 8 is an organic material such as resin, etc.

For example, the protection layer 8 is located in the border region 102, a gap is formed between the protection layer 8 and the display region 101, and the inorganic barrier layer 32 covers the protection layer 8. The protection layer 8 may be provided separately, or may be provided in the same layer and made of the same material as an insulation layer in the display region 101 (for example, an interlayer insulation layer in the pixel circuit of the display region, etc.), that is, the insulation layer in the display region 101 is used to form the protection layer 8, so as to simplify the manufacture process and manufacture difficulty of the display panel 10.

For example, as illustrated in FIG. 1 and FIG. 2A, forming the peripheral circuit 2 includes forming a second signal wire 22 extending from the display region 101 to the border region 102 along the first direction; the second signal wire 22 includes a first portion 221 and a second portion 222 connected in series with each other, the first portion 221 is exposed by the above opening (for example, the first opening 3101), the second portion 222 is not exposed by the opening, that is, an orthographic projection of the first portion 221 on the base substrate 1 overlaps with an orthographic projection of the first opening 3101 on the base substrate 1, and an orthographic projection of the second portion 222 on the base substrate 1 does not overlap (no overlapping portion exists) with the orthographic projection of the first opening 3101 on the base substrate 1. The first portion 221 includes at least two wires connected in parallel, and the second portion is a single wire. For example, in FIG. 1, the first portion 221 includes two wires 2211 and 2212 connected in parallel, and the second portion 222 includes a first section 2221 and a second section 2222, at a position corresponding to the inner portion 311 of the organic barrier layer 31, the first section 2221 is a single wire; at a position corresponding to the first opening 3101, the second signal wire 22 is divided into two parallel wires 2211 and 2212, and the two wires 2211 and 2212 are both connected to the first section 2221 in series; at a position corresponding to the outer portion 312 of the organic barrier layer 31, the two wires 2211 and 2212 are merged into a single wire again, that is, merged into the second section 2222. In the manufacture process of the display panel 10, the second signal wire 22 overlapping with the orthographic projection of the first opening 3101 on the base substrate 1 is easily broken or damaged, therefore, the scheme that the first portion 221 including at least two wires connected in parallel can avoid the problem that the signal wire exposed by the first opening 3101 is easily damaged.

For example, the manufacture method of the display panel 10 illustrated in FIG. 3 and FIG. 4 includes: forming a plurality of the openings. For example, forming the above first opening 3101 and the non-annular opening 3102 spaced apart from the first opening 3101. The non-annular opening 3102 is located in the outer portion 312 of the organic barrier layer 31 or the inner portion 311 of the organic barrier layer 31. For example, in this embodiment, the case that the non-annular opening 3102 is located in the outer portion 312 of the organic barrier layer 31 is taken as an example. In other embodiments, the non-annular opening may be provided in the inner portion 311, or the non-annular opening may be provided in both the inner portion 311 and the outer portion 312.

As illustrated in FIG. 3 and FIG. 4, the first portion 221 of the second signal wire 22 includes a first segment and a second segment. The first segment and the second segment are respectively exposed by the first opening 3101 and the non-annular opening 3101. The second portion 222 of the second signal wire 22 includes a first section 2221, a second section 2222, and a third section 2223 that are not exposed by the first opening 3101 and the non-annular opening 3102. That is, an orthographic projection of the first segment on the base substrate 1 overlaps with an orthographic projection of the first opening 3101 on the base substrate 1, and an orthographic projection of the second segment on the base substrate 1 overlap with an orthographic projection of the non-annular opening 3102 on the base substrate, orthographic projections of the first section 2221, the second section 2222 and the third section 2223 on the base substrate 1 do not overlap (no overlapping portion exists) with the orthographic projection of the first opening 3101 on the base substrate 1 and the orthographic projection of the non-annular opening 3102 on the base substrate 1. Referring to FIG. 3 and FIG. 4, both the first segment and the second segment include at least two wires connected in parallel. The first section 2221, the second section 2222, and the third section 2223 of the second portion 22 are all single wires. The first segment of the first section 221 includes two wires 2211 and 2212 connected in parallel, and the second segment of the first section 221 includes two wires 2213 and 2214 connected in parallel. The first section 2221, the first segment of the first section 221 including the two wires 2211 and 2212, the second section 2222, the second segment of the first section 221 including the two wires 2213 and 2214, and the third section 2223 are successively connected in series with each other. The technical effect of this design refers to the above descriptions.

For example, the above structures of the display panel may be formed by a lithography process and a semiconductor process. For example, the light-emitting layer of light-emitting device can be formed by methods such as ink-jet printing (IJP), evaporation, or the like; the cathode of light-emitting device is formed by methods such as thermal evaporation, sputtering, or the like; the inorganic barrier layer and the inorganic encapsulation layer are formed by methods such as chemical vapor deposition (CVD). Those skilled in the art may select the methods according to conventional techniques.

For example, the manufacture method of the display panel further includes a package process. For example, a thin film package as illustrated in FIG. 2A may be adopted, that is, a face seal is performed using the encapsulation layer 4, or the frame sealant 11, the encapsulation sealant 13, and the encapsulation substrate 15 illustrated in FIG. 2C are used for package, so as to further block outside moisture, oxygen, etc. from entering the display region.

Structures and technical effects not mentioned in the embodiments of the manufacture method of the display panel are the same as those in the embodiments of the display panel, please refer to the previous descriptions.

What have been described above are only specific implementations of the present disclosure, the protection scope of the present disclosure is not limited thereto, and the protection scope of the present disclosure should be based on the protection scope of the claims.

What is claimed is:

1. A display panel, comprising:
a base substrate having a main surface, wherein the main surface comprises a display region and a border region surrounding the display region, the border region comprises a peripheral circuit region, and a peripheral circuit is provided in the peripheral circuit region;
a planarization layer, comprising a part in the display region and a part in the border region;
a light-emitting device, in the display region and on a side, away from the base substrate, of the planarization layer; and
a pixel circuit, in the display region and configured to control light emitting state of the light-emitting device;
a barrier structure, wherein at least a part of the barrier structure is in the peripheral circuit region on the base substrate, and the barrier structure comprises an organic barrier layer and an inorganic barrier layer covering the organic barrier layer;
an encapsulation substrate on a side, away from the base substrate, of the barrier structure;
a frame sealant, in the peripheral region and respectively connected with the base substrate and the encapsulation substrate; and
an encapsulation sealant, which is at least in the peripheral circuit region;
the display panel further comprises:
an encapsulation layer, covering and sealing the display region and at least part of the border region, wherein both the encapsulation layer and the inorganic barrier layer extend from the display region to the border region, and both a part of the encapsulation layer that overlaps with the organic barrier layer in the direction perpendicular to the main surface of the base substrate and a part of the encapsulation layer that does not overlap with the organic barrier layer in the direction perpendicular to the main surface of the base substrate are in contact with the inorganic barrier layer; the encapsulation sealant is between the encapsulation layer and the encapsulation substrate, and covers the encapsulation layer.

2. The display panel according to claim 1, wherein one end of the frame sealant connected with the base substrate is in direct contact with the base substrate, and an end of the frame sealant connected with the encapsulation substrate is in direct contact with the encapsulation substrate.

3. The display panel according to claim 1, wherein the organic barrier layer is on a side, close to the display region, of the frame sealant, and the inorganic barrier layer comprises a portion between the organic barrier layer and the frame sealant;
the encapsulation sealant covers and contacts the portion of the inorganic barrier layer between the organic barrier layer and the frame sealant.

4. The display panel according to claim 3, wherein the encapsulation sealant covers and contacts an upper surface, away from the base substrate, of the inorganic barrier layer, and/or, the encapsulation sealant covers an entirety of the inorganic barrier layer.

5. The display panel according to claim 1, wherein the encapsulation layer comprises an inorganic encapsulation layer, the inorganic encapsulation layer and the inorganic barrier layer overlap each other in the direction perpendicular to the main surface of the base substrate.

6. The display panel according to claim 5, wherein the encapsulation layer further comprises an organic encapsulation layer stacked with the inorganic encapsulation layer in the direction perpendicular to the main surface of the base substrate.

7. The display panel according to claim 1, wherein the opening comprises a first opening which is in a closed annular shape and surrounds the display region.

8. The display panel according to claim 7, wherein the first opening which is in the closed annular shape divides the organic barrier layer into an inner portion close to the display region and an outer portion away from the display region, the inner portion is in a closed annular shape and surrounds the display region, and the outer portion is in a closed annular shape and surrounds the first opening.

9. The display panel according to claim 7, wherein a width of the opening in a direction from the border region to the display region ranges from 1 μm to 5000 μm.

10. The display panel according to claim 1, wherein a direction from the display region to the border region is a first direction, and the peripheral circuit comprises a first signal wire and a function component;
the first signal wire extends in a second direction that intersects the first direction.

11. The display panel according to claim 10, wherein an orthographic projection of the first signal wire on the base substrate is within the orthographic projection of the organic barrier layer on the base substrate, and an orthographic projection of the opening on the base substrate does not overlap with the orthographic projection of the first signal wire on the base substrate.

12. The display panel according to claim 11, wherein the peripheral circuit comprises a plurality of first signal wires, a gap is provided between two adjacent first signal wires of the plurality of the first signal wires, and the orthographic projection of the opening on the base substrate is within an orthographic projection of the gap between two adjacent first signal wires of the plurality of the first signal wires on the base substrate.

13. The display panel according to claim 1, wherein a direction from the display region to the border region is a first direction, and the peripheral circuit comprises a second signal wire extending from the display region to the border region along the first direction;
the second signal wire comprises a first portion and a second portion that are connected in series with each other, an orthographic projection of the first portion on the base substrate overlaps with an orthographic projection of the opening on the base substrate, and an orthographic projection of the second portion on the base substrate does not overlap with the orthographic projection of the opening on the base substrate.

14. The display panel according to claim 13, wherein the second signal wire is electrically connected with a gate wire in the display region, and the gate wire is a scanning signal wire that provides a scanning signal to pixel units in the display region.

15. The display panel according to claim 14, wherein the second signal wire further comprises a portion in the display region, and the second signal wire and the gate wire in the display region constitute an integral structure.

16. The display panel according to claim 1, wherein a direction from the display region to the border region is the first direction, and a width d of the border region in the first direction satisfies d≥5 mm.

17. The display panel according to claim 1, wherein a material of the organic barrier layer comprises an organic material, the organic material comprises a resin, and the organic barrier layer comprises a water-absorbing material or an oxygen-absorbing material;
   a material of the inorganic barrier layer comprises at least one selected from a group consisting of silicon oxide, silicon nitride and silicon oxynitride.

18. The display panel according to claim 1, wherein the encapsulation sealant comprises a water absorbing material, an oxygen absorbing material or a heat insulating material.

19. The display panel according to claim 1, further comprising:
   a planarization layer comprising a portion in the display region and a portion in the border region, wherein the portion, in the border region, of the planarization layer, serves as the organic barrier layer.

20. The display panel according to claim 1, wherein the part of the planarization layer in the border region serves as the organic barrier layer of the barrier structure.

* * * * *